United States Patent [19]
Mok

[11] Patent Number: 5,493,534
[45] Date of Patent: Feb. 20, 1996

[54] REMOTELY RE-PROGRAMMABLE PROGRAM MEMORY FOR A MICROCONTROLLER

[75] Inventor: Tsung D. Mok, Cupertino, Calif.

[73] Assignee: Atmel Corporation, San Jose, Calif.

[21] Appl. No.: 443,237

[22] Filed: May 17, 1995

Related U.S. Application Data

[63] Continuation of Ser. No. 100,899, Jul. 29, 1993.

[51] Int. Cl.$^6$ .................................................. G11C 13/00
[52] U.S. Cl. ................ 365/226; 365/189.01; 365/185.33
[58] Field of Search ...................................... 365/226, 218, 365/189.01, 230.01, 94, 900

[56] References Cited

U.S. PATENT DOCUMENTS 4,757,503   7/1988   Hayes et al. ............................. 371/21
4,780,814  10/1988   Hayek ..................................... 364/200
4,782,439  11/1988   Borkar et al. ........................... 364/200

Primary Examiner—Terrell W. Fears
Attorney, Agent, or Firm—Schneck & McHugh

[57] ABSTRACT

A single chip microcontroller has a plurality of I/O ports which communicate directly and indirectly with an electrically programmable and erasable read only memory array used as a program store circuit. The PEROM array provides for fast erasing and reprogramming, either directly from a local host or remotely. The plurality of ports provides alternative access routes to the memory store, thereby providing a capability for verifying microinstructions immediately after writing them, one at a time. A random access memory, RAM, is also provided. The PEROM array is like hard disk storage in a microcontroller. A low voltage power supply has a connected charge pump which provides a programming and erase high voltage for the PEROM array.

12 Claims, 7 Drawing Sheets

| $V_{cc}$ = 5V (3 V) | DRAIN | CONTROL GATE | SENSE GATE | SOURCE |
|---|---|---|---|---|
| CLEAR | GROUND | 17 V | 17 V | GROUND |
| WRITE | 15 V | 17 V | GROUND | 6 V (3 V) |
| READ | 1.8 V (1.0 V) | 5 V (3.0 V) | 1.8 V (1.0 V) | GROUND |

REMOTELY RE-PROGRAMMABLE PROGRAM MEMORY FOR A MICROCONTROLLER

This is a continuation of copending application Ser. No. 08/100,899 filed on Jul. 29, 1993.

TECHNICAL FIELD

The invention relates to an integrated circuit non-volatile program memory combined with a microcontroller in a single chip.

BACKGROUND ART

Single chip microcontrollers have been known for over ten years. These devices are a complete computer on a chip including a central processing unit (CPU), random access memory (RAM) for data, an electrically programmable read-only memory (EPROM) for program memory, or alternatively read only memory (ROM) and various registers, timing circuits, latches, ports and interface circuits. One of the earliest microcontrollers made was the 8051, first manufactured by Intel Corporation in 1981. This part featured separate program and data memories with unique addresses for each. Previously, the 8051 has been a platform for other microcontroller improvements by others. See U.S. Pat. No. 4,782,439 to Borkar et al. relating to improved memory access and U.S. Pat. No. 4,780,814 to Hayek relating to a communications interface.

Smart cards contain single chip microcontrollers which combine a CPU with various types of memory including RAM, ROM, EPROM and EEPROM in combination with various ports, memory access and even a gate array for logic. Such cards use EPROM memory for program storage and all other memory for data storage.

One of the problems with EPROM storage is that UV-light exposure is required to erase the device prior to reprogramming. Where reprogramming is required in the field, it is frequently easier to replace the entire controller with a fresh one than to attempt an erase and rewrite operation for the program memory. EEPROMs have not been considered as program memories because array size has been thought to be incompatible with microcontroller functions, except perhaps for very small arrays.

While microcontrollers operating on low voltage power supplies exist in the prior art, such supplies are not suitable for EEPROMs which require voltages above 17 V for programming.

An object of the invention was to devise a field re-programmable microcontroller having a self-contained program memory.

Another object of the invention was to devise such a microcontroller operating on a single low voltage power supply.

SUMMARY OF INVENTION

The above object has been achieved in a single chip microcontroller having a program memory of very large size in comparison to a data memory and which is rapidly erasable and rewriteable. Rapid erase and rewrite is provided using flash memory transistors, a type of electrically programmable and erasable read only memory (PEROM) transistor which is erased in blocks and uses a low voltage power supply in combination with a charge pump for programming and erase voltage generation. Large size is provided using an array of highly compact PEROM cells.

Flash transistors allow rapid erasing of the entire memory within a matter of milliseconds, rather than minutes for UV-light exposure. Although flash memory arrays are known, their use has either been external to microcontroller chips or limited to data storage applications. In using a flash memory array for instructions, care must be exercised in avoiding accidental erasure of the instructions. This is achieved by adding special programming modes to the usual read-write modes, e.g. a chip erase mode. These modes are established using chip input-output (I/O) pins in unique combinations. Only when the chip is in the chip erase mode, can flash memory be written with all ones, which is the initial memory state.

Multiple ports are provided by using the 8051 chip architecture, including pin configuration, but without an EPROM. This architecture has the advantage of providing program memory with its own bus and two ports for high speed address and instruction transfer. By adopting the known 8051 pin configuration, compatibility can be realized with a well known family of parts, with only certain changes in programming mode signals to accommodate a flash memory array.

A preferred minimum size flash memory where the present invention would be effective is 4k bytes or 32k bits. Internal RAM is usually smaller in cell count because RAM either stores intermediate results or works with external RAM. A typical size is 128 bytes. A minimum flash memory size of 4k bytes is selected to provide space for complex programs completely contained on a microcontroller chip, yet with an ability to rapidly erase and rewrite the program. In applications, such as program development or field reprogrammability, the present invention fills a gap in microcontroller systems. By providing a large ratio of flash to RAM cells, we provide an analogue to hard disk storage on a single chip controller.

BEST MODE FOR CARRYING OUT THE INVENTION

Figure 1:
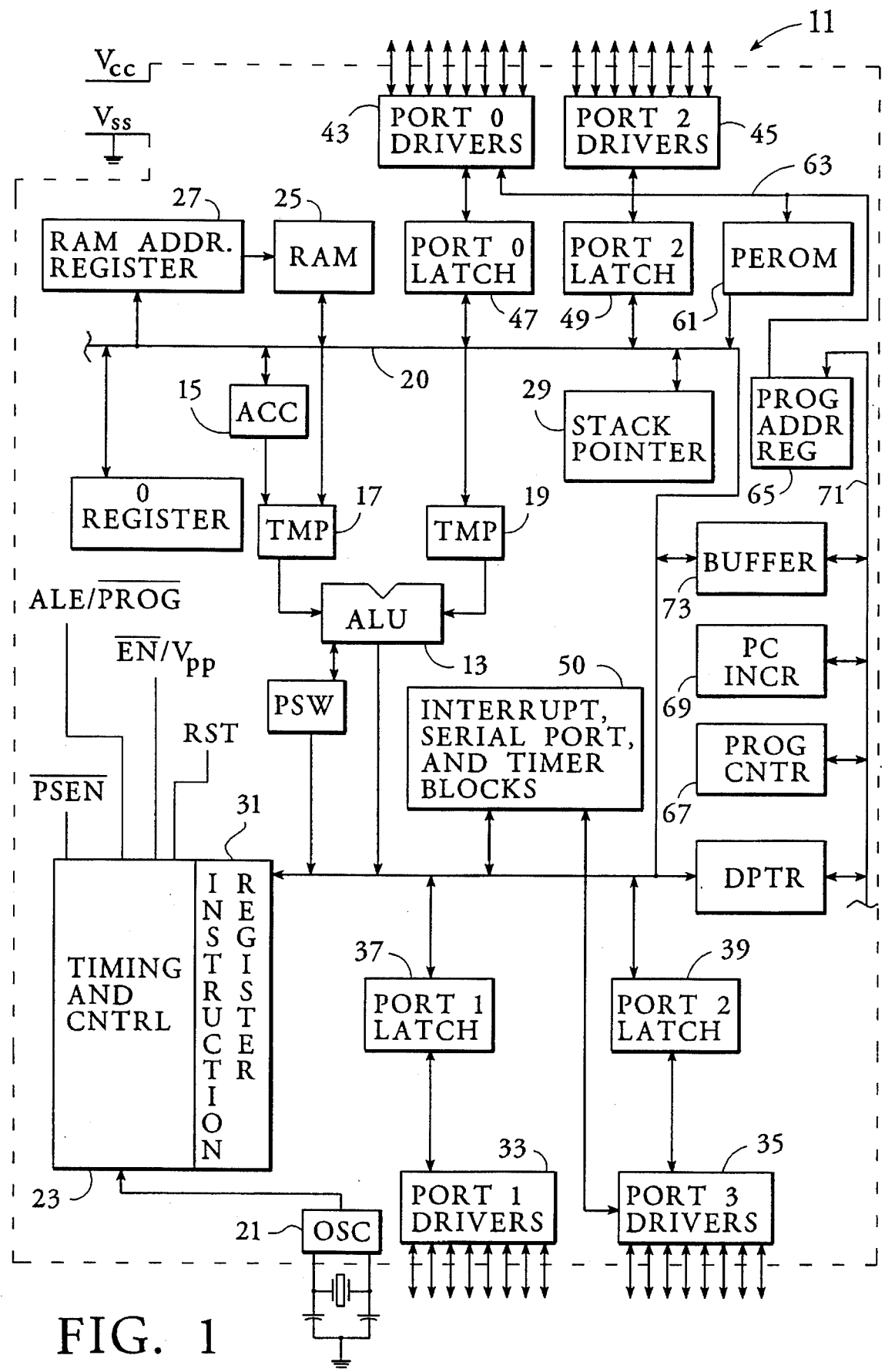
FIG. 1 is a block diagram of the electrically re-programmable program memory with combined microcontroller of the present invention.

With reference to FIG. 1, a microcontroller 11 is shown. The chip architecture includes circuits which are generally known to microcontrollers and in particular to the type 8051 microcontroller manufactured by Intel Corporation and other companies. The pin names and descriptions are found in U.S. Pat. No. 4,780,814 to G. Hayek. The microprocessor portion of the controller consists of ALU 13, an arithmetic logic unit, which is fed by an accumulator 15 via a temporary register 17. A second temporary register 19 also feeds the ALU 13. An oscillator 21 generates pulses for the timing and control circuit 23 which generates timing signals discussed below with reference to FIG. 2. A data bus 20 links many of the circuit components including a random access memory 25, memory address register 27, stack pointer 29 and instruction register 31. The functionality of the microcontroller is enhanced by a plurality of ports, including ports 33 and 35 which communicate directly with bus 20 through port latches 37 and 39 respectively. Similarly, ports 43 and 45 communicate with data bus 20 through port latches 47 and 49 respectively.

One of the ports, port 35, is connected to interrupt and timer circuits 50, and a single pair of lines of port 35 also serve as transmit and receive lines for handling data from a remote location. The remaining ports are configured for receiving and writing data to a local external memory, such as a connected external host system. All of the above circuitry is generally well understood since it is common to 8051 types of microcontrollers and is described in the prior U.S. Pat. No. 4,780,814. In the present invention, primary reliance is on parallel data transfer through ports 43, 45 and 33.

The present invention employs a programmable erasable read only memory 61 (PEROM) in a flash memory configuration for storing microinstructions which are fed to ALU 13 through various registers and the random access memory 25. Unlike an EPROM array, transistors of the PEROM memory are electrically programmable and erasable read only memory transistors which are arranged in blocks. A flash memory block has a minimum size of a page, such as 64 bytes, and a maximum size of the entire array. The advantage of this arrangement is that blocks are erased at one time, allowing for very rapid erasure of the memory. It has been recognized that non-volatile storage is valuable in microcontrollers, as evidenced by use of EPROM transistors in microcontrollers as a program store. However, these are first generation non-volatile memory devices and have been improved by PEROM technology.

The present invention takes advantage of the plurality of ports of a multiport controller for rapidly erasing, as well as writing microinstructions to the non-volatile PEROM memory 61. Erase signals are provided through ports 35, 45 and pins $\overline{PSEN}$, $\overline{PROG}$, $V_{pp}$ and RST. After rapid erasure, control signals allow rewriting of microprogram instructions in the PEROM memory 61.

An address bus 63 connects the PEROM memory to the ports 43 and 45, as well as to a program address register 65. A program counter 67 and an incrementer 69 are linked to the program register 65 by means of a local bus 71. Note that the communication from bus 63 to PEROM circuit 61 is unidirectional and that the output from PEROM 61 to data bus 20 is also unidirectional so that PEROM circuit 61 is isolated from direct input communication from data bus 20, although indirect communication is possible through buffer 73. The buffer 73 also provides a path so that ports 33 and 35 can communicate to the address bus 63 via the program address register 65.

Figure 2:
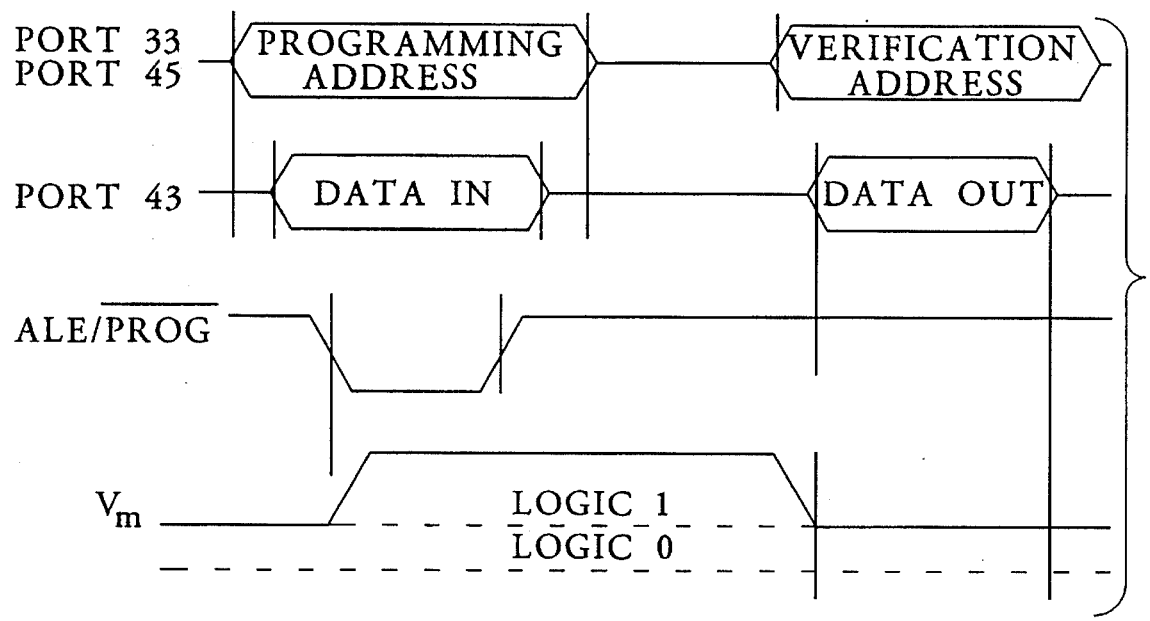
FIG. 2 is a timing diagram explaining the operation of the circuit of FIG. 1.

In FIG. 2, the first waveform shows that a desired memory location is accessed on address lines through ports 33 and 45. The second waveform shows that appropriate data is written on the data lines after an address has been set using port 43. The third waveform shows that the address is latched using latch 47. Note that when the address latch enable signal, ALE, is high, the inverse programming signal, $\overline{PROG}$, is low and vice-versa, i.e. programming can occur when the address latch is not enabled. The programming voltage is always generated on-chip by stepping up $V_{cc}$ using a charge pump to obtain $V_M$. The fourth waveform shows that the programming voltage is generated at an appropriate level, allowing the data to be written in the memory cells, when the inverse programming signal of the third waveform is low.

Data is verified by reading it back on-the-fly via the address and data lines in the interval following a programming cycle, as shown in the first and second waveforms. This takes advantage of the bidirectional nature of ports 33 and 45, as well as port 43, when communicating with an external host.

The following is a summary of the programming algorithm. The first step is to input the desired memory byte location on the address lines associated with the appropriate ports. The next step is to input instructions or data on the lines associated with appropriate ports and then activate the correct combination of control signals. Address latch enable, ALE, is pulsed to program a byte into the PEROM. The above procedure is repeated, changing address and data until the end of the file is reached. During each cycle programmed data is read back via address and data lines on-the-fly, to confirm that programming data is correct.

To erase the entire PEROM, i.e. to write all ones, the proper combination of control signals and the ALE is used. Specifically, ALE is held low while at the same time a combination of pins is used to define a programming mode for erasing the PEROM. In the 8051 pin configuration, the same pins which are used to establish the chip identification, or "signature", are used to define a read data mode, a write date mode, as well as the chip erase mode. Verification readback is implemented after the write operation. The erase operation must be executed before the memory array can be reprogrammed.

Unlike flash cells of others, which use hot-electron injection as the programming mechanism, we have found that tunneling is a preferred programming means. PEROM transistors made using a single or double metal layering process, see U.S. Pat. No. 4,833,096 to J. Huang et al., assigned to the assignee of the present invention, provide increased compactness.

Figure 3:
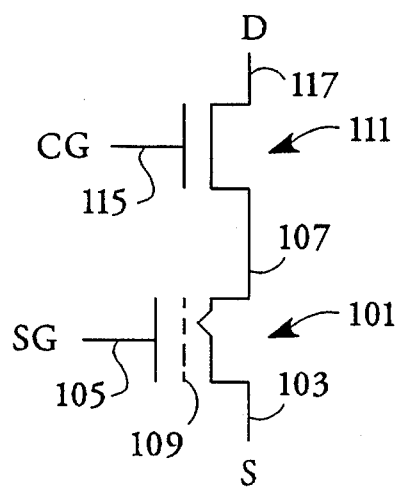
FIG. 3 is a schematic of a high performance two transistor PEROM cell used in the program memory of FIG. 1.

Each storage cell comprises a pair of transistors, as shown in FIG. 3. Storage transistor 101 has a source 103, a gate 105, a drain 107 and a floating gate 109. By applying the appropriate high voltage between the drain electrode 107 and a control electrode adjacent to the floating gate 105, the floating gate becomes charged. By reversing the voltage, the floating gate is erased.

Rather than provide a special high voltage power supply, a charge pump is used to multiply the common voltage supply, $V_{cc}$, to the programming voltage level, $V_M$. Since the common supply can be only 3 volts, the entire chip operation can be operated from this low voltage supply. The charge pump is described below.

The charge pump of the present invention, described below, allows a low voltage power supply to be used in the present invention where voltages over 17 V are needed for erasing and programming PEROMs. By obviating an external high voltage supply, the present invention may operate from small batteries in portable computers. This is ideal in the present situation because the presence of multiple ports allows for remote downloading of instructions into the PEROM program memory.

Drain 107 is extended and serves as the source for select transistor 111. This transistor has a drain 117 and a control gate 115 connected to the row select line. Drain 117 is connected to the column select line and to a sense amplifier. The present invention provides 4096 bytes of storage cells, each byte consisting of 8 bits. Accordingly, the cells may be grouped in an array of 8 cells by 4096.

Figure 4:
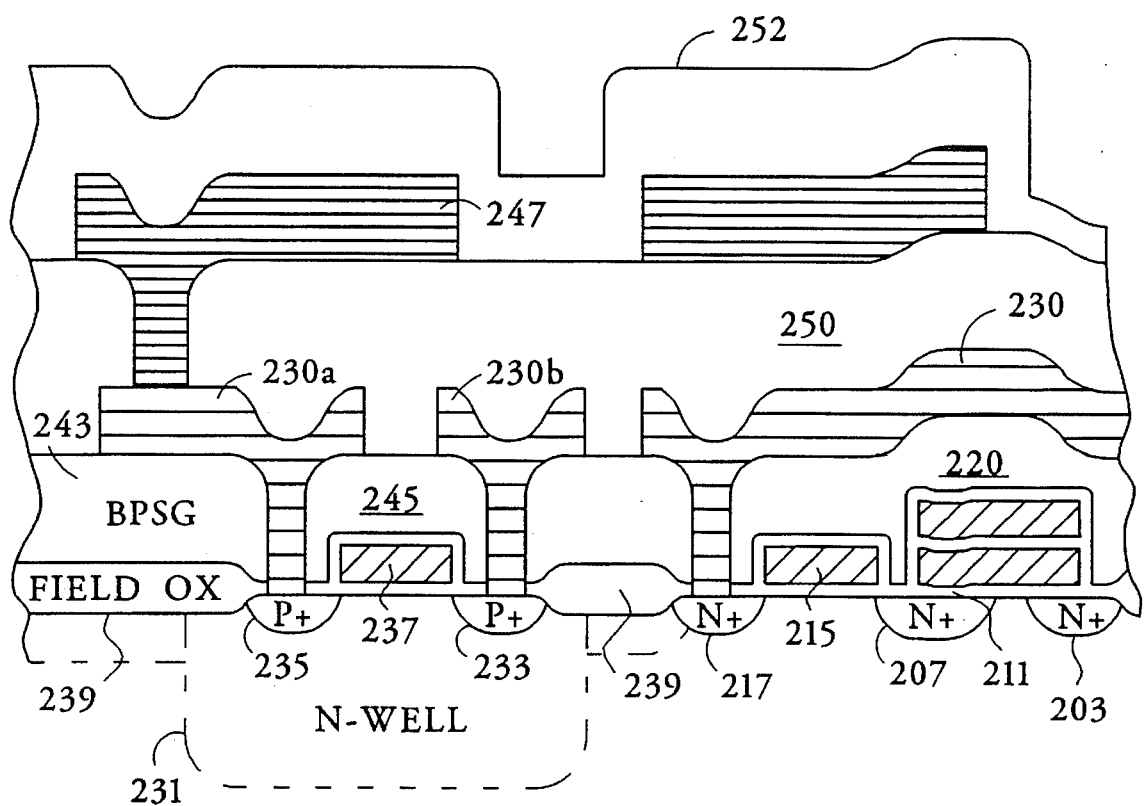
FIG. 4 is a side sectional view of a fabrication process for CMOS PEROM transistors, including the two transistors of FIG. 3.

FIG. 4 shows the fabrication of a PEROM transistor cell, generally as described in U.S. Pat. No. 4,833,056 mentioned above. The memory transistor 101 of FIG. 3 is shown with its source 203 spaced apart from drain 207 in a P-type substrate. The floating gate 209 is a polysilicon layer, termed "poly one", the charge storage element which is located overlapping portions of the source and drain. A portion of the floating gate 209 dips downwardly and approaches drain 207 at a tunneling region 211 where the floating gate is spaced from the drain by a very thin layer of oxide known as tunnel oxide. A control gate 205, another polysilicon layer, termed "poly two", controls the charge storage and erase operation by applying an appropriate voltage between drain 207 and the electrode 205 thereby initiating tunneling action. The storage transistor is separated from another transistor corresponding to the select transistor 111 in FIG. 4 by an oxide layer 220. Drain 207 of the memory transistor serves as the source for the select transistor while a drain electrode 217 is located in the substrate. A gate electrode 215, a poly two element, is spaced between the source and drain. A first metal layer tube 230 contacts drain 217. The metal layer 230 is connected to sense amps and the bit line, just like drain 117 in FIG. 4.

FIG. 4 shows a third transistor fabricated in an N-well 231 with a source region 233 and a spaced apart drain region 235. A gate 237 is spaced between source and drain. This transistor is isolated from the prior pair by field oxide regions 239, which in turn are insulated from metal layer regions 230a and 230b by glass layer 243 and thick oxide layer 245. A second metal layer 247 makes contact with metal layer 230a in order to separately control the N-well transistor. This transistor is a row driver transistor and so it is important to have spacing between the first metal layer 230 and the second metal layer 247. This spacing is provided by the inter-metal dielectric layer 250 which is a thick oxide layer. Lastly, a passivation layer 252 is provided over the top of the second metal layer to protect the circuit.

Figure 5:
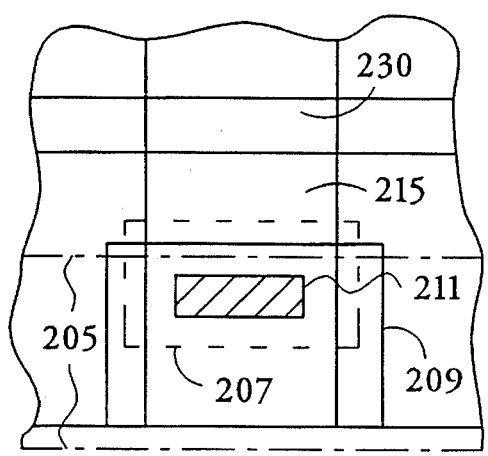
FIG. 5 is a top view of the floating gate portion of the memory transistor shown in FIG. 4, illustrating layout of the thin oxide tunneling region.

A top view of the central storage region of the electrically programmable erasable read only memory transistor 101 of FIG. 4 is shown in FIG. 5. The dashed line is subsurface, while the solid lines are above the surface. Drain region 207 has a small rectangle of thin oxide 211 forming a tunneling window between the floating gate, represented by the rectangle 209, a poly one layer. Over the poly one layer is the poly two layer 205 represented by broken lines. A poly two layer also forms the gate 215 of the second or sense transistor. Metal layer 230 covers both transistors. The transistor pair shown in FIGS. 3–4 is repeated such that there are at least 32 PEROM memory cells for each random access memory cell. This ratio allows adequate program memory which may be modified in the field.

Figures 6, 10:
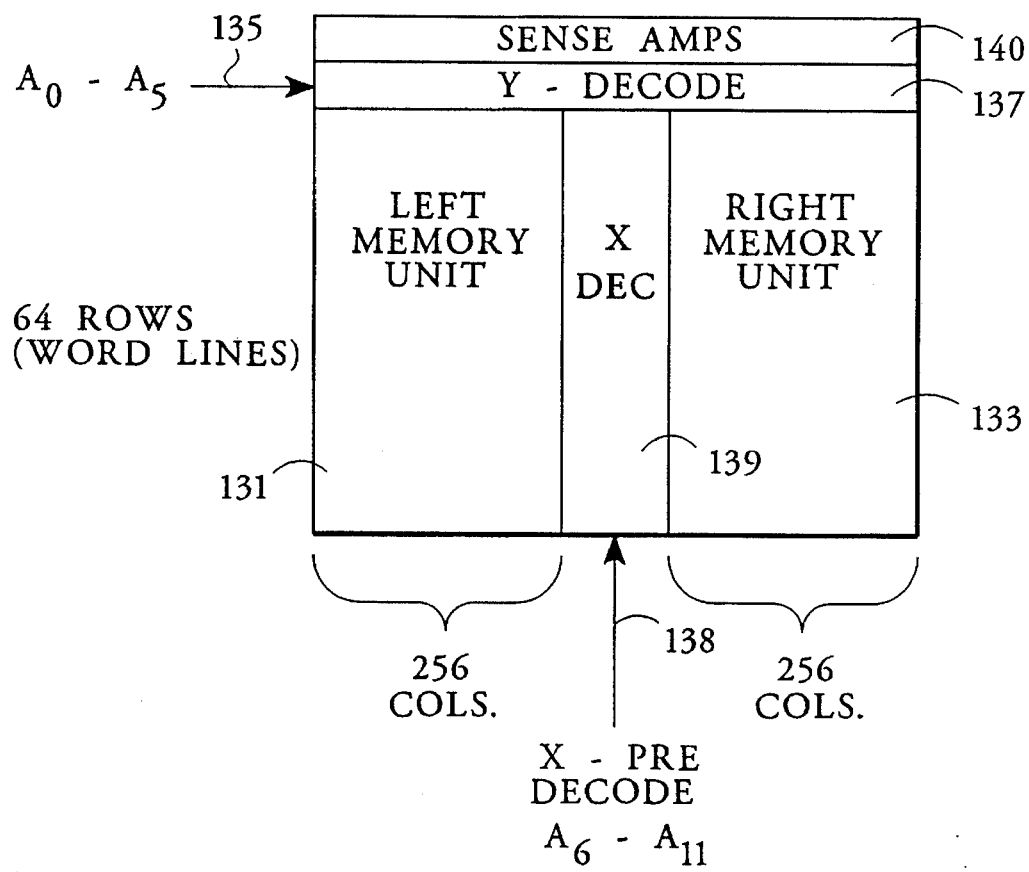
FIG. 6 is an architectural plan of the PEROM memory unit shown in FIG. 1.
FIG. 10 is a voltage state diagram for reading, writing and erasing PEROMs in the memory unit shown in FIG. 1.

With reference to FIG. 6, the architectural plan for the PEROM memory unit 61 of FIG. 1 is shown to comprise symmetric left and right memory units 131 and 133. Each half of the memory unit comprises 64 rows by 256 columns, the entire 4k byte memory unit comprising 64 rows by 512 columns. The memory is addressed by six address bits on line 135 directed to Y decode circuits. Six address bits are also received on line 138 for X decode circuits 139 servicing the left and right memory units. Both memory units have column lines connected to individual sense amplifiers 140 for reading data stored on storage transistors. The left and right memory units 131 and 133 are symmetric, so that a description of one memory unit also describes the other.

Figure 7:
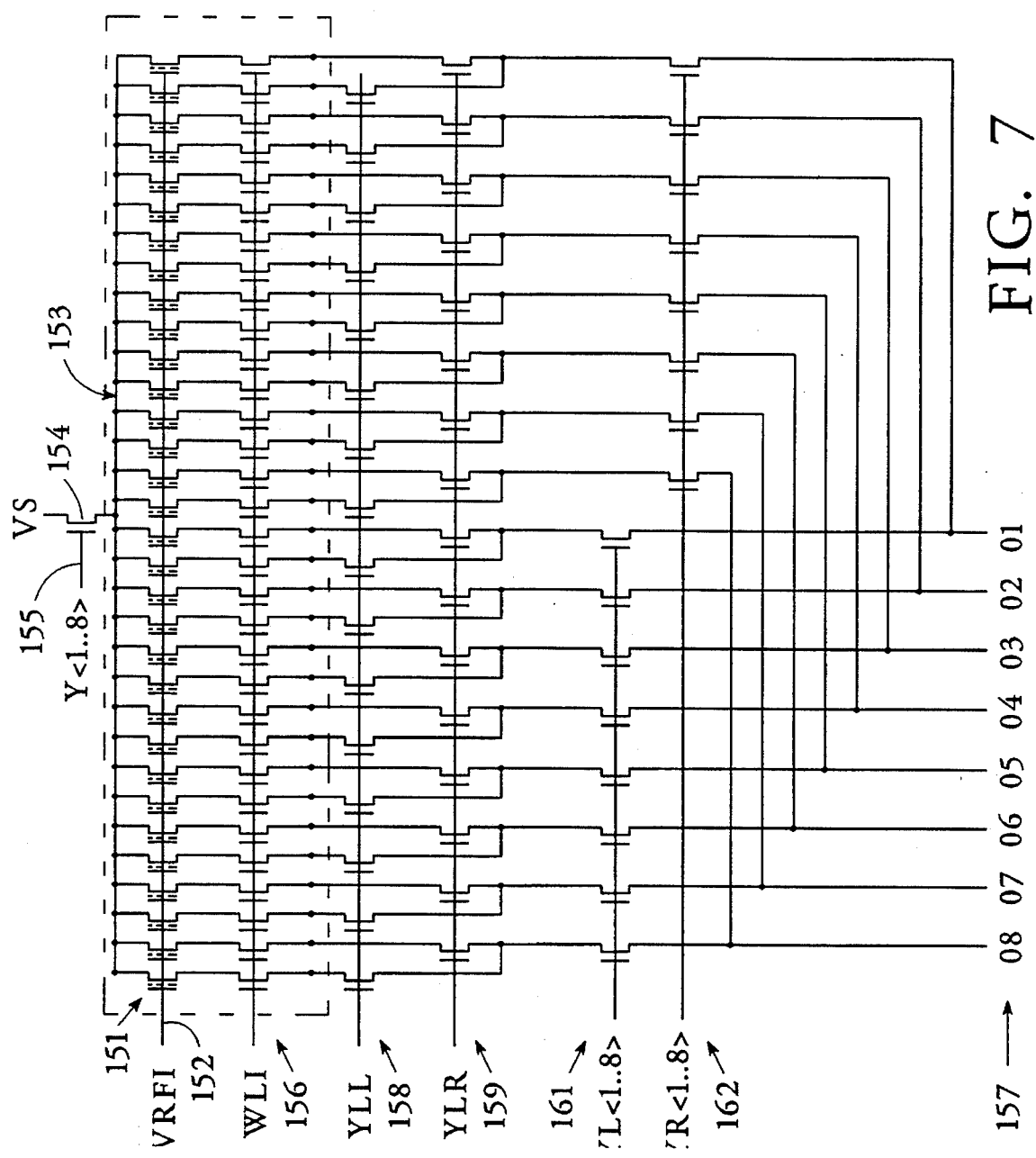

With reference to FIG. 7, a single row of PEROM transistors 151 has a control gate connected to receive a VRFI signal along line 152. For purposes of description, only the i-th row is shown of the 64 rows in FIG. 7, indicated by a dashed line around this row. A common source line 153 has voltages supplied to it in accord with FIG. 10. Transistor 154 is used to supply the different voltages shown in FIG. 10 when strobed by a Y address signal on gate 155.

Each storage transistor in the row 151 is connected to a word line select transistor in the row of transistors 156. The drain of each transistor in row 151 is connected to the source of each transistor in row 156 similar to the configuration shown in FIG. 4. The word line transistors 156 serve to isolate the storage transistors and each may be accessed from one of the eight sense amplifier lines 157 through the multiplexing transistors in rows 158 and 159 and the Y-select transistors in rows 161 and 162. The Y-select lines in rows 161 and 162 divide the array into left and right halves. The multiplexing lines 158 and 159 allow a single sense amplifier to service a pair of storage transistors within each half of the array.

Figure 8:
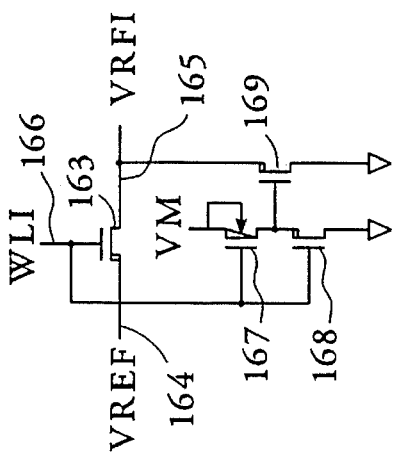
FIGS. 7 and 8 are schematic diagrams of the right memory unit shown in FIG. 6.

The i-th storage row 151 and the row select line 156 are connected to the i-th pass transistor array shown in FIG. 8. With reference to FIG. 8, the pass transistor 163 has its source connected to a reference voltage, $V_{ref}$ along line 164 and its drain outputting the reference voltage VRFI along line 165. The gate of the transistor 166 is connected to the word line select signal, WLI for the i-th row. The same signal is applied to the inverter pair 167 and 168 which control the gate of a discharge transistor 169. A circuit of the type shown in FIG. 8 is provided for each word line.

Figure 9:
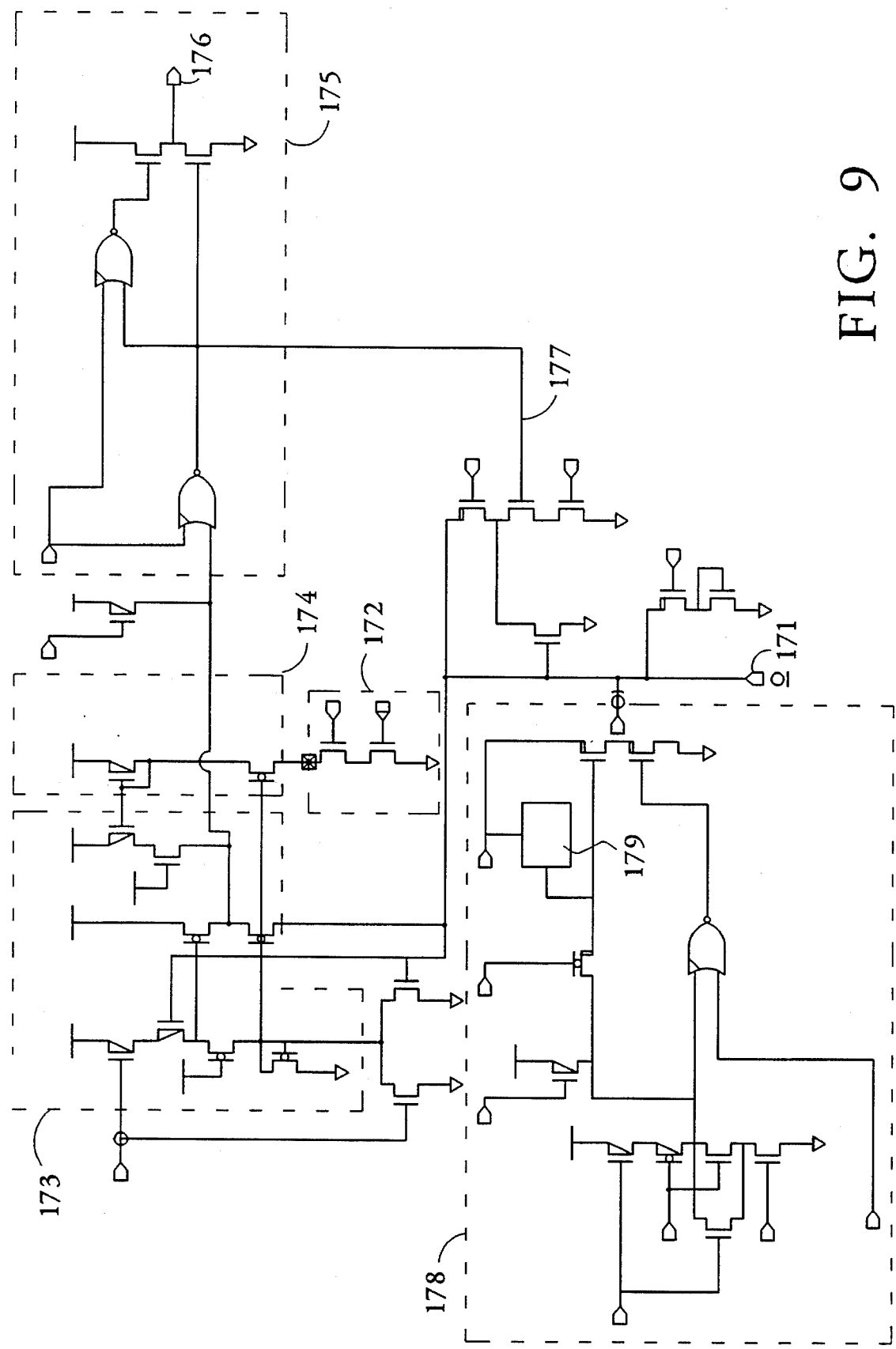
FIG. 9 is a schematic of the sense amplifiers for reading data in the memory unit shown in FIG. 8.

Each of the column lines 157 is connected to a sense amplifier of the type shown in FIG. 9. A connection to a column line is made at input point 171 which attempts to read the variable threshold transistor in row 151 of FIG. 7, an electrically programmable erasable read only memory transistor. In such a transistor, the conduction threshold is shifted between a high and a low state. The threshold for conduction is read with reference to a dummy cell within block 172. Conduction of the transistors which comprise the dummy cell is evaluated by balanced arms 173 and 174. Evaluation logic circuit 175 reads the conduction state of the memory transistor with reference to the dummy cell and provides a logic output on pin 176. The conduction state signals are also transmitted on line 177 for restoring the balance between circuit arms 173 and 174. A high voltage level shifting circuit 178 is able to apply a high voltage from a charge pump through block 179 onto the column line through pin 171. This circuit applies the programming voltage to the PEROM transistor.

Figure 11A:
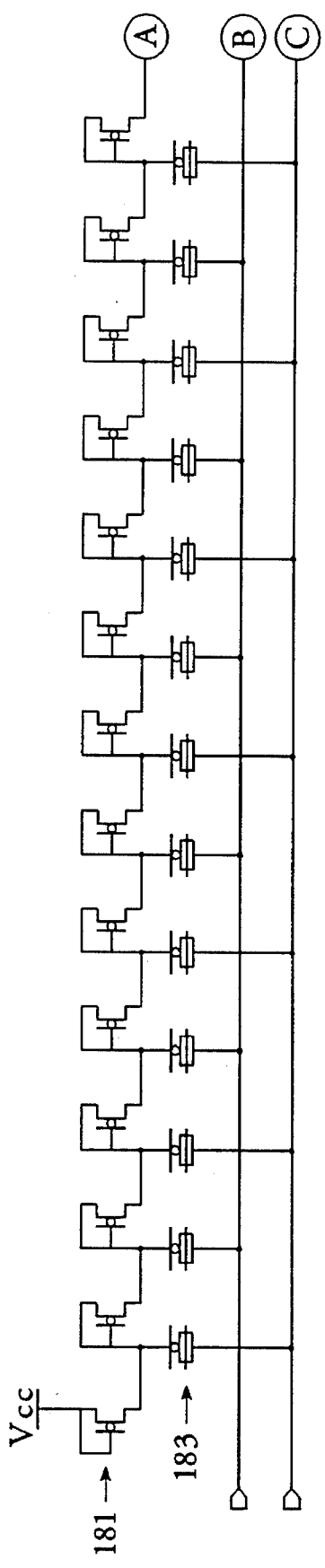
FIGS. 11a and 11b are schematic diagrams of a charge pump for transforming chip $V_{cc}$ voltage to the high programming voltages shown in FIG. 10. Lines A, B, C of FIG. 11a connect to corresponding lines in FIG. 11b.
Figure 11B:
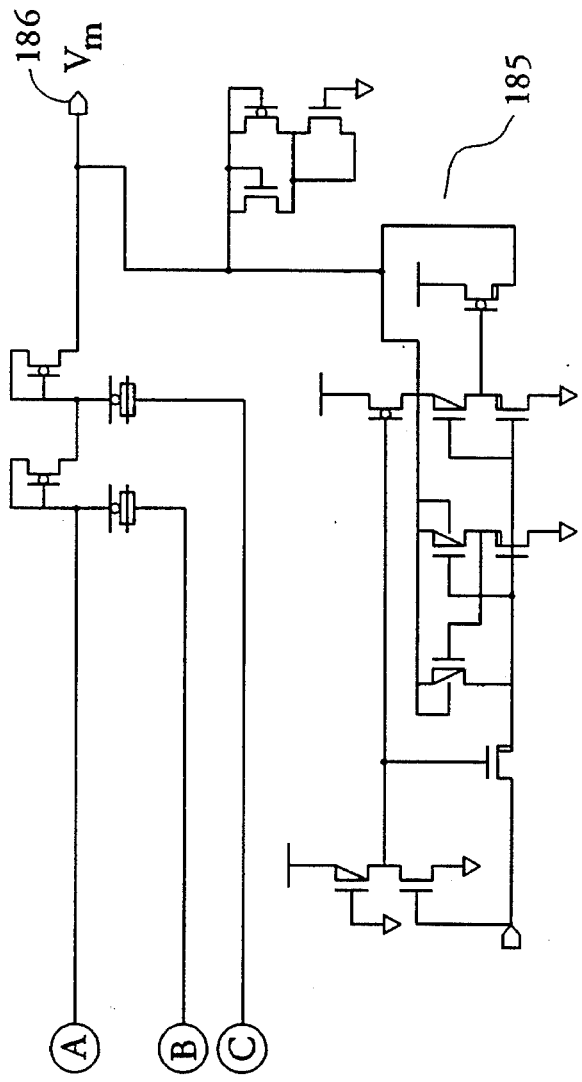

FIG. 10 shows the voltages which are applied to an PEROM cell of FIG. 7. The column labeled "DRAIN" is pin 171 in FIG. 9 which communicates with each column line, subject to multiplexing by the multiplex rows 158 and 159 in FIG. 7. The "SENSE GATE" column of FIG. 10 refers to VRFI in FIGS. 7 and 8. The "CONTROL GATE" refers to the signal WLI in FIGS. 7 and 8. The column labeled "SOURCE" refers to line 153 in FIG. 7 which floats except when connected to ground through transistor 154. The voltages shown in parentheses in FIG. 10 are for a low level mode of operation while the values outside of parentheses represent the ordinary levels. The 17 and 15 V. levels are derived from a charge pump shown in FIGS. 11a and 11b. Here, an array of seven stages in a row of zero threshold transistors 181, configured as diodes, are each connected to a capacitor in row 183. Each capacitor, tied to one of the out-of-phase clock lines 182 or 184, boosts the voltage of a preceding transistor capacitor pair. As one line is clocked a potential difference is established across a transistor-capacitor pair. The charge in the capacitor is shifted or pumped to the next transistor-capacitor pair as the second line is clocked with a phase opposite to the previous phase. The electric charge in the capacitor of each preceding stage is shifted to the capacitor of the next stage. Opposite phase clocking shifts or pumps charge from the low level of $V_{cc}$ to the high voltage of $V_M$. A clamp and discharge circuit 185 fixes the circuit output to the high voltage value, transmits it on output pin 186 and is able to discharge the circuit upon command at pin 187.

Figure 12:
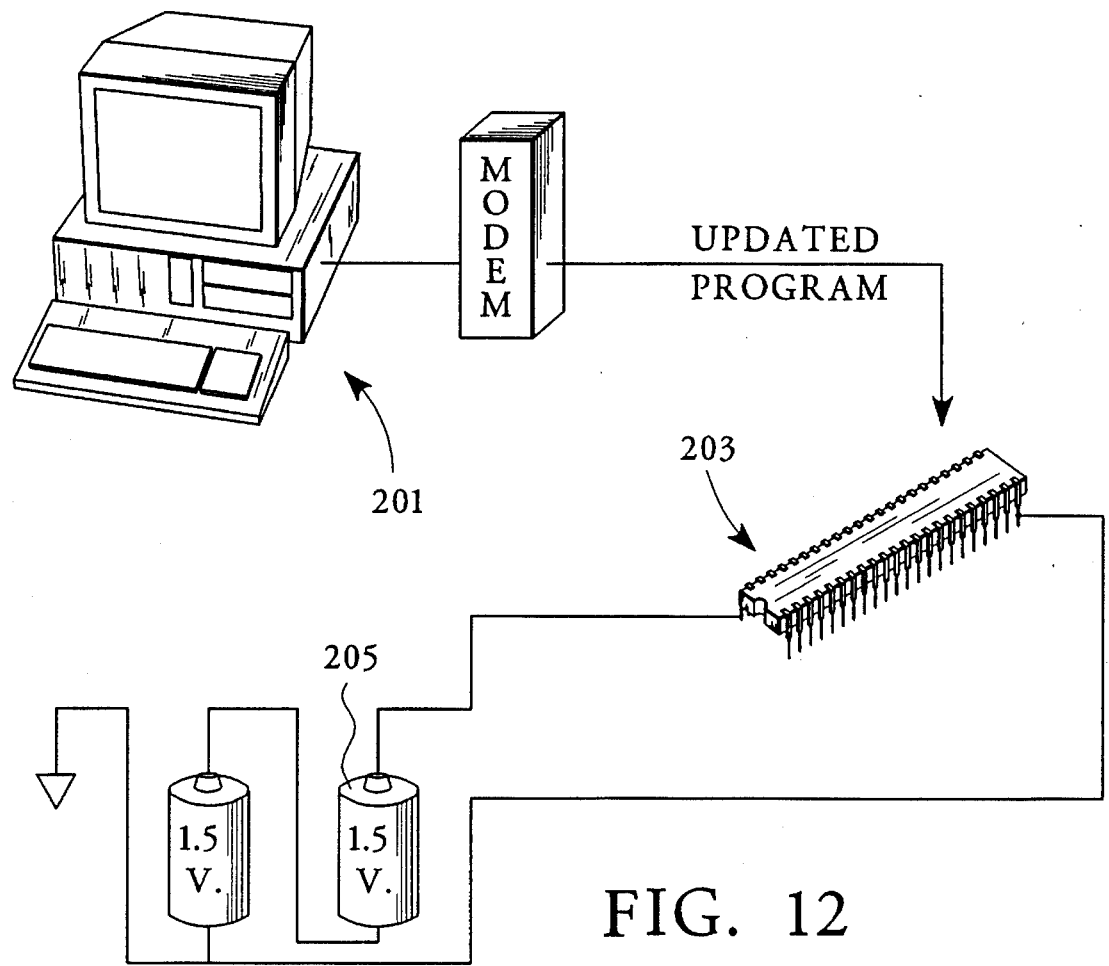
FIG. 12 is a plan view of a host system downloading a program to a microcontroller having a PEROM re-programmable non-volatile memory.

With reference to FIG. 12, a host system 201 contains updated programs for microcontrollers. Presently, it is time consuming to install updated programs in field applications, such as traffic signals, robotic machines, communication and transportation equipment, etc. Most frequently, an EPROM integrated circuit must be changed. Now, however, the updated program is transmitted via modem to one of the ports of microcontroller 203. The microcontroller follows the architecture shown in FIG. 1 and is able to receive serial communications through port 35 which has connected communications circuits 50 for handling data from a remote location. The updated program is stored in a non-volatile PEROM or flash memory of the chip 203 until an erase signal is transmitted, memory cleared and a new updated program is transmitted and received. The integrated circuit chip 203 may be carried in a portable microcontroller, such as a laptop computer or a transportation system. In such applications, operation from small batteries is frequently convenient. The present invention is especially suited to such applications because the power conversion circuitry allows a single low voltage power supply, normally used as $V_{cc}$, to be used to supply the write and clear signals of the non-volatile memory as shown in FIG. 10. A single low voltage power supply 205, consisting of a pair of 1.5 V batteries, supplies the entire power supply for the chip 203. Such power supply allows for compact packaging and light weight, essential in modern applications.

I claim:

1. A re-programmable memory system with a microcontroller comprising, a remote host computer having a memory store with updated programs for execution by field microcontrollers, a single chip microcontroller having a single low voltage power supply, the microcontroller electrically communicating with said remote host computer and having electrically programmable and erasable read only memory cells and RAM memory cells, the electrically programmable and erasable read only memory cells connected as a main program store having power conversion means to generate voltage levels necessary for clearing the electrically programmable and erasable read only memory cells and writing therein using the low voltage power supply.

2. A re-programmable memory system with a microcontroller comprising, a remote host computer having a memory store with updated programs for execution by field microcontrollers, a single chip microcontroller having a single low voltage power supply, the microcontroller electrically communicating with said remote host computer and having PEROM and RAM memory cells, the PEROM memory cells connected as a main program store having power conversion means for clearing the PEROM cells and writing therein using the low voltage power supply, said power conversion means comprises a multi-stage charge pump having a low voltage input and a high voltage output and a clamp circuit means for holding the high voltage on command.

3. A re-programmable memory system with a microcontroller comprising, a remote host computer having a memory store with updated programs for execution by field microcontrollers, a single chip microcontroller having a single low voltage power supply, the microcontroller electrically communicating with said remote host computer and having PEROM and RAM memory cells, the PEROM memory cells connected as a main program store having power conversion means for clearing the PEROM cells and writing therein using the low voltage power supply, said power conversion means comprises a multi-stage charge pump having a low voltage input and a high voltage output and a discharge circuit means for discharging the high voltage on command.

4. A program store circuit arrangement in an integrated circuit microcontroller of the type having an arithmetic logic unit, a plurality of registers associated with the arithmetic unit for executing program instructions and operating on data comprising, an array of electrically programmable and erasable read only memory transistors arranged in blocks whereby blocks of transistors may be simultaneously erased, an address bus connected to said array, said address bus in bidirectional communication with a port capable of receiving microinstructions from an external source, a data bus connected to said array as an output in a unidirectional manner and connected to microcontroller circuits on the data bus whereby said array is isolated from direct receipt of data from the data bus but communicates outwardly to the microcontroller circuits on the data bus, a random access memory array connected to the data bus, a bidirectional buffer separating the address bus from the data bus but permitting communication therebetween, a plurality of bidirectional I/O port means for bidirectional exchange of program address and data information, and a low voltage power supply having a connected charge pump means for converting the low voltage supply to a voltage level adequate for programming and erasing the electrically programmable and erasable read only memory transistors.

5. The circuit arrangement of claim 4 wherein the array of electrically programmable and erasable read only memory transistors comprise storage cells of two transistors including a select transistor and a bit storage transistor, both transistors operable from a single low voltage source.

6. The circuit arrangement of claim 5 wherein the bit storage transistor comprises a sense gate and a floating gate, the floating gate disposed over a region of thin tunnel oxide.

7. The circuit arrangement of claim 4 wherein said plurality of bidirectional I/O port means comprises, first and second bidirectional I/O port means connected to the address bus and the data bus for communication with an external program and data memory, and a third bidirectional I/O port means connected to the data bus for sharing tasks of the first and second port means.

8. In a microcontroller having an arithmetic logic unit, an accumulator and registers feeding the arithmetic logic unit, bidirectional I/O ports, an address bus and a data bus, the program store circuit improvement comprising, an array of electrically programmable and erasable read only memory transistors arranged in blocks whereby blocks of transistors may be simultaneously erased, the array connected to microcontroller circuits via the address and data buses, an array of random access memory transistors connected to the microcontroller circuits via the address and data buses, and a low voltage power supply having a connected charge pump means for converting the low voltage supply to a voltage level which programs and erases the electrically programmable and erasable read only memory transistors.

9. The microcontroller of claim 8 wherein the array of electrically programmable and erasable memory transistors comprise a flash transistor array.

10. The microcontroller of claim 8 wherein the array of electrically programmable and erasable memory transistors comprise storage cells of two transistors including a select transistor and a bit storage transistor, both transistors operable from a single low voltage source.

11. The microcontroller of claim 8 wherein the bit storage transistor comprises a sense gate and a floating gate, the floating gate disposed over a region of thin tunnel oxide.

12. The microcontroller of claim 11 further comprising means for selectively discharging said sense gate.

* * * * *